(12) United States Patent
Berggren

(10) Patent No.: US 10,183,862 B2
(45) Date of Patent: Jan. 22, 2019

(54) METHOD OF STRAIN GAUGE FABRICATION USING A TRANSFER SUBSTRATE

(71) Applicant: GM GLOBAL TECHNOLOGY OPERATIONS LLC, Detroit, MI (US)

(72) Inventor: Stephen A. Berggren, Carmel, IN (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 199 days.

(21) Appl. No.: 15/264,846

(22) Filed: Sep. 14, 2016

(65) Prior Publication Data

US 2018/0072569 A1 Mar. 15, 2018

(51) Int. Cl.
*B81C 1/00* (2006.01)
*H01L 41/09* (2006.01)
*H01L 41/113* (2006.01)

(52) U.S. Cl.
CPC ........ *B81C 1/0088* (2013.01); *B81C 1/00825* (2013.01); *B81C 1/00865* (2013.01); *B81C 1/00888* (2013.01); *B81C 1/00904* (2013.01); *H01L 41/094* (2013.01); *H01L 41/0926* (2013.01); *H01L 41/1136* (2013.01); *B81C 2201/056* (2013.01)

(58) Field of Classification Search
CPC .............. H01L 41/0926; H01L 41/094; H01L 41/1136; B81C 1/00825; B81C 2201/056; B81C 1/00865; B81C 1/0088; B81C 1/00888; B81C 1/00904
USPC .......................................................... 438/52
See application file for complete search history.

(56) References Cited

U.S. PATENT DOCUMENTS

| | | | | |
|---|---|---|---|---|
| 5,952,572 A | * | 9/1999 | Yamashita | G01C 19/56 73/504.04 |
| 2004/0189145 A1 | * | 9/2004 | Pletner | G03F 7/70725 310/311 |
| 2011/0204750 A1 | * | 8/2011 | Fujii | H01L 41/094 310/330 |
| 2014/0054728 A1 | * | 2/2014 | Maling | H01L 29/84 257/415 |
| 2016/0061677 A1 | * | 3/2016 | Han | B81B 7/0048 257/415 |
| 2017/0363486 A1 | * | 12/2017 | Okulov | B81B 7/00 |

* cited by examiner

*Primary Examiner* — Michael Jung

(57) ABSTRACT

A method of strain gauge fabrication is presented herein. The method includes: providing a first substrate having a cavity side; providing a second substrate having a semiconductor side; positioning the second substrate in relation to the first substrate such that the semiconductor side and the cavity side are contactable; processing the second substrate such that the first and second substrates are substantially joined via the semiconductor side and the cavity side; and etching the second substrate to define a strain gauge cantilevered over the cavity side of the first substrate.

11 Claims, 4 Drawing Sheets

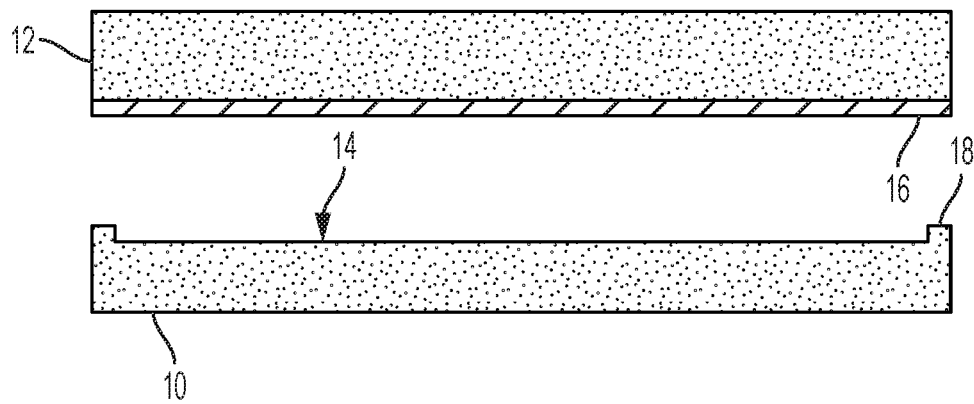
FIG. 2A
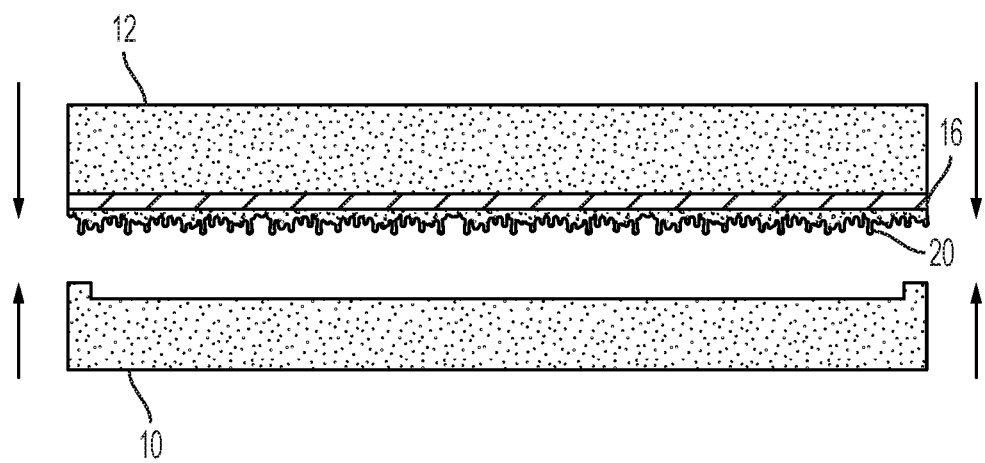
FIG. 2B
ETCHING THE SECOND SUBSTRATE (E.G., VIA A DRIE PROCESS) SO AS TO CREATE ONE OR MORE STRAIN GAUGES, WHICH MAY BE DEFINED BY A RELEASE PATTERN, CANTILEVERED OVER THE CAVITY SIDE OF THE FIRST SUBSTRATE
FIG. 2C

METHOD OF STRAIN GAUGE FABRICATION USING A TRANSFER SUBSTRATE

INTRODUCTION

Silicon strain gauges are generally required to be no more than 25 micrometers thick. Requiring these gauges to be this thin enables the flexing required for their functioning. As such, during gauge fabrication processing, thinning, dicing, and handling substrates has proven to be difficult, expensive, and time consuming. It is therefore desirable to be able to fabricate strain gauges without the need for thinning and dicing substrates and while also allowing for the easy handling of finished gauges.

SUMMARY

A method of strain gauge fabrication is presented herein. The method includes: providing a first substrate having a cavity side; providing a second substrate having a semiconductor side; positioning the second substrate in relation to the first substrate such that the semiconductor side and the cavity side are contactable; processing the second substrate such that the first and second substrates are substantially joined via the semiconductor side and the cavity side; and etching the second substrate to define a strain gauge cantilevered over the cavity side of the first substrate.

The method may further include removing the strain gauge from the first substrate. The strain gauge may be removed through the implementation of a vacuum device with a pick tip. The processing limitation may include coating a portion of the second substrate with a bonding material and subsequently bonding the second substrate to the first substrate, such that the first and second substrates are substantially joined. The release pattern may be etched onto the second substrate to define the strain gauge. The release pattern may be etched through a DRIE process and the release pattern may be shaped as a rectangle with three complete sides and a fourth perforated side. The second substrate may be etched so as to define a plurality of strain gauges configured to reduce the second substrate real estate.

A system of strain gauge fabrication is further presented herein. The system includes a first substrate and a second substrate. The first substrate includes a cavity side. The second substrate includes a semiconductor side. The semiconductor side of the second substrate is configured to be joined to the cavity side of the first substrate. The second substrate is also configured to be etched through a DRIE process, so as to create a strain gauge cantilevered over the cavity side of the first substrate.

The strain gauge may be configured to be removable from the first substrate by a vacuum device comprising a pick tip. The second substrate may be configured to be coated with a bonding material. The semiconductor side of the second substrate may also be configured to be joined to the cavity side of the first substrate via the bonding material.

A release pattern may be etched onto the second substrate to define the strain gauge. The release pattern may have a rectangle having three complete sides and a fourth perforated side. The second substrate may be further configured to be additionally etched by a DRIE process so as to create a plurality of strain gauges cantilevered over the cavity side of the first substrate. The plurality of strain gauges may further be configured to reduce the second substrate real estate. Each of the plurality of strain gauges may have the release pattern including a rectangle with three complete sides and a fourth perforated side.

BRIEF DESCRIPTION OF THE DRAWINGS

The disclosed examples will hereinafter be described in conjunction with the following drawing figures, wherein like numerals denote like elements, and wherein:

FIG. 2A is a side view substantially showing a step of an embodiment of a method of strain gauge fabrication presented herein;

FIG. 2B is a side view of another step of the gauge fabrication method;

FIG. 2C represents another step of the gauge fabrication method;

DETAILED DESCRIPTION

Figure 1:
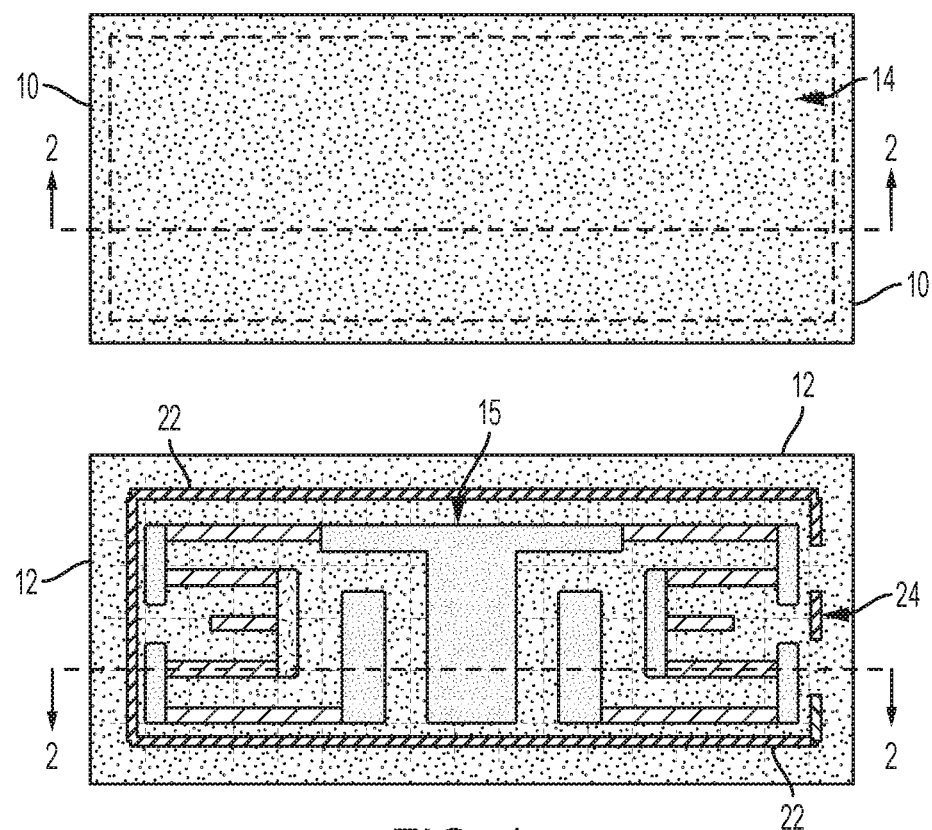
FIG. 1 illustrates a top down view of a first substrate wafer and a second substrate wafer with imprinted strain gauge pattern thereon.

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the exemplary aspects of the present disclosure. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

A strain gauge is a device used to measure various strains on an object. In doing so, the strain gauge takes advantage of the object's electrical conductance and its own dependence on the object's physical geometry. As such, as the object is deformed, the strain gauge is deformed, causing the gauge's electrical resistance to change. For instance, when an object has been stretched within the limits of its elasticity, the strain gauge generally becomes narrower and elongated and thus the gauge's end-to-end resistance increases. However, when the object is compressed, the strain gauge will broaden and shorten and thus the gauge's end-to-end resistance decreases. From the measured resistance, subsequently, the amount of induced stress may be inferred.

Different applications provide different uses for a strain gauge. Microscale strain gauges, widely used in microelectromechanical systems (MEMS) (e.g., microchips), may be applied to measure variable strains such as, but not limited to, those induced by force, acceleration, pressure or sound generated by moving parts. For example, airbags in cars are often triggered with MEMS accelerometers. A strain gauge applied to one or more of these accelerometers may therefore help to determine the probability of accelerometer failure during vehicle dynamics analysis and testing.

Strain gauges have, historically, been created through a process in which an entire silicon substrate wafer is mounted onto a carrier plate, thinned to a desired thickness (e.g., 25 micrometers) by grinding and etching equipment, and then diced into smaller strain gauges by an independent set of dicing equipment. After the strain gauges are created out of the wafer, each must be manually moved and mounted onto a saw tap and die. Thinning and dicing the substrate wafer as well as the subsequent handling thereof has, however, proven to be difficult, expensive, and time consuming. Often, the grinding and dicing equipment wears down and requires expensive retooling procedures before any new strain gauges can be adequately fabricated. Due to their fragility, many strain gauges are also destroyed while being manually transferred from the substrate to the saw tap and die. A method that thus eliminates the need for the grinding and dicing equipment as well as any specialized equipment necessary for the manual handling of the finished strain gauges would greatly simplify gauge fabrication as well as reduce manufacturing costs.

One such method of fabricating strain gauges is shown by referencing FIGS. 1 and 2A through 2E. With reference to FIG. 1, there can be seen a first substrate wafer 10 and a second substrate wafer 12. As shown, the first substrate wafer 10 has a centrally-located rimmed cavity 14 on one side and is generally flat on the opposite side. The second substrate 12 has an epitaxial layer 16 coating one side and, similar to that of the first wafer 10, is generally flat on the opposite side. In this embodiment, each of the wafers 10, 12 is made from silicon. The epitaxial layer 16 may moreover be made by epitaxial growth and may be made through a metal organic chemical vapor deposition (MOCVD), molecular beam epitaxy (MBE), or any similar process. Skilled artisans will see that the epitaxial semiconductor properties of silicon epiwafers, such as the second wafer 12, are known for strain gauge fabrication. A strain gauge pattern 15 imprinted on the second wafer 12 can also be seen. One skilled in the art will see that the disclosed pattern design is one of many which may be chosen and should not limit the method and system presented herein.

FIG. 2A shows a step of the method in which the second substrate wafer 12 is positioned to hover over the first substrate wafer 10. As shown, second wafer 12 is flipped prior to being hovered over first wafer 10 and thus the epitaxial layer 16 directly faces the cavity 14 and corresponding perimeter rim 18. Each wafer is typically of a thickness of 625 micrometers (μall), which may be considered standard in this technological field.

FIG. 2B shows a step of the method in which the epitaxial layer 16 of the second substrate wafer 12 is coated with a bonding material 20. The bonding material 20 may be a high-performance temporary adhesive made from material compositions of thermoplastics and thermosets (such as, for example, those sold under the trade name ZONEBOND™). The bonding material 20 coat may moreover be applied through a bonding method such as, but not limited to, direct bonding, surface activated bonding, plasma activated bonding, anodic bonding, eutectic bonding, glass frit bonding, adhesive bonding, thermocompression bonding, reactive bonding, and transient liquid phase diffusion bonding. However, skilled artisans will see that other bonding material 20 types and application processes may be applied to substrate wafer 12. Once the coat has been applied, the first and second substrate wafers are pressed into each other.

Figure 2D:
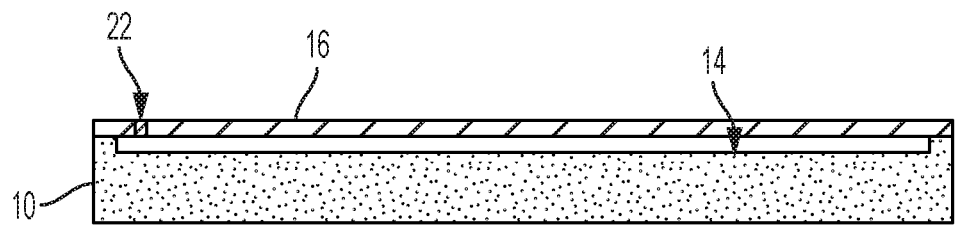
FIG. 2D is a side view of another step of the gauge fabrication method.

FIGS. 2C and 2D together represent the substrate wafer 10 and epitaxial layer 16 being bonded together, after the second substrate wafer 12 has been properly removed from the epitaxial layer 16 through an etching process. With reference to FIG. 2D, the rim 18 and outer edges of the epitaxial layer 16 are those bonded portions and the cavity 14 is situated between the epitaxial layer 16 and remaining portions of first substrate wafer 10. FIG. 2C moreover represents the second substrate wafer 12 being processed such that only the epitaxial layer 16 remains. This process may be conducted through the substrate wafer portion of the second wafer 12 being etched back through a wet silicon etch process such as, but not limited to, a selective silicon etch. Such etching will occur until the remaining epitaxial layer is of a desired strain gauge 15 thickness, for example, one ideal for the required flexing of a particular application (e.g., 25 micrometers (μm)). The etching processes are also used in a pattern generation manner to create a plurality of strain gauges 15 such as the one which has been shown in FIG. 1.

A release pattern 22 is also etched around the perimeter of each strain gauge 15 and through the body of epitaxial layer 16. This process may be conducted through an anisotropic etching process such as, but not limited to, a deep-reactive-ion etching process (DRIE). In this embodiment, the release pattern 22 is a rectangle having three complete sides and a fourth perforated side 24 (FIG. 1). As such, the fourth side 24 enables each strain gauge 15 to be cantilevered over the cavity 14 of the first wafer 10. It should be understood that first wafer 10 may be constructed to have multiple cavities 14 divided by multiple rims 18 such that, for instance, each strain gauge 15 cantilevers over its own independent cavity 14 section. It should be further understood that other release pattern 22 configurations may cantilever gauge 15 over the cavity 14.

Figure 2E:
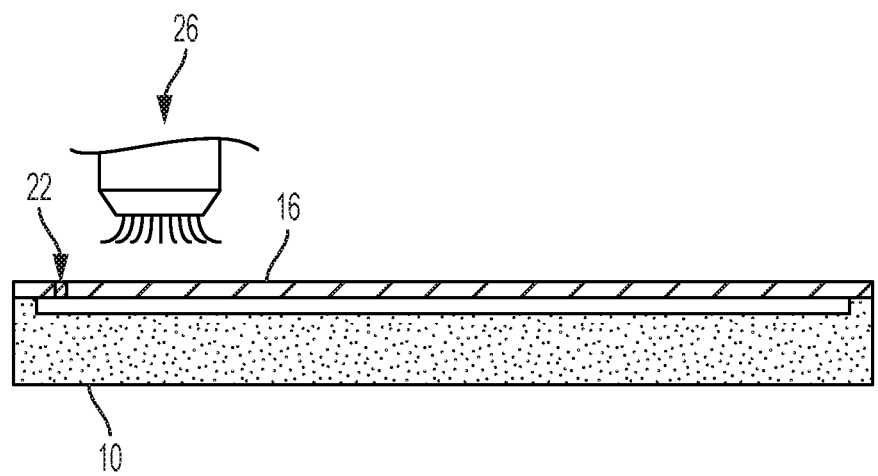
FIG. 2E is a side view of another step of the gauge fabrication method.
Figure 2F:
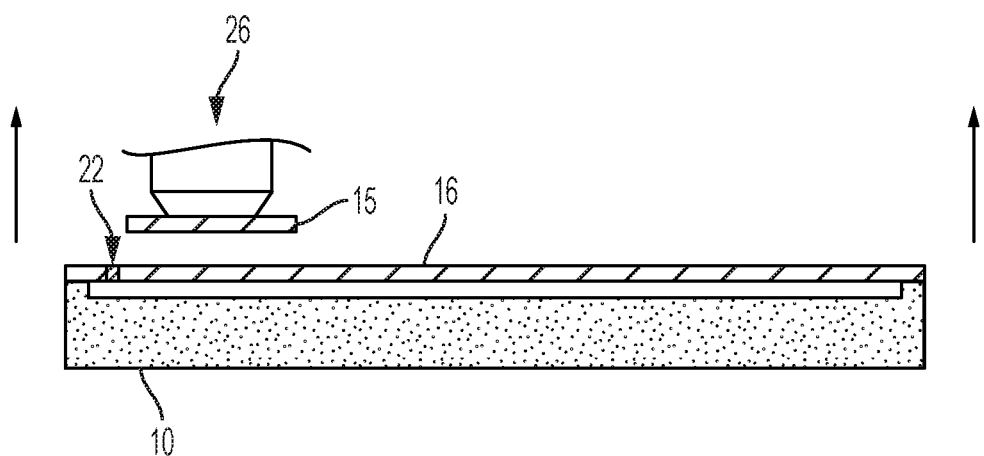
FIG. 2F is a side view of another step of the gauge fabrication method.

As shown by referring to both FIGS. 2E and 2F, implementing the release pattern 22 in such a way as that of the one disclosed herein, easy removal of each strain gauge 15 may be conducted through the implementation of a vacuum device with a pick tip 26. As such, through its sucking action, the pick tip 26 is placed on one of the strain gauges 15 and lifted from the rest of the remaining epitaxial layer 16, by breaking along the perforated fourth side 24, to be removed from the remaining epitaxial layer 16 being left behind. Upon removal, the strain gauge 15 is then remounted onto a standard saw tape and die configuration (not shown). This may be carried out in an automated manner that allows for less variation in unwanted strain gauge thickness. It should be appreciated that the disclosed pick tip may be made from an elastomeric material and may be one of multiple types and other pick tip shapes/designs may otherwise be implemented.

Figure 3A:
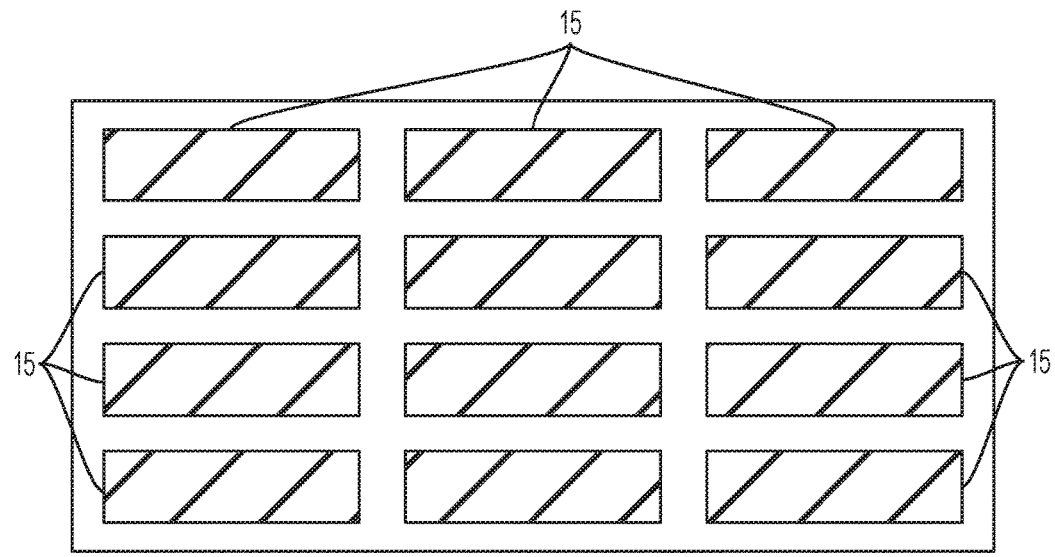
FIG. 3A represents a top down view of a substrate wafer with imprinted strain gauges thereon, having been generated by a known method and system of strain gauge fabrication.
Figure 3B:
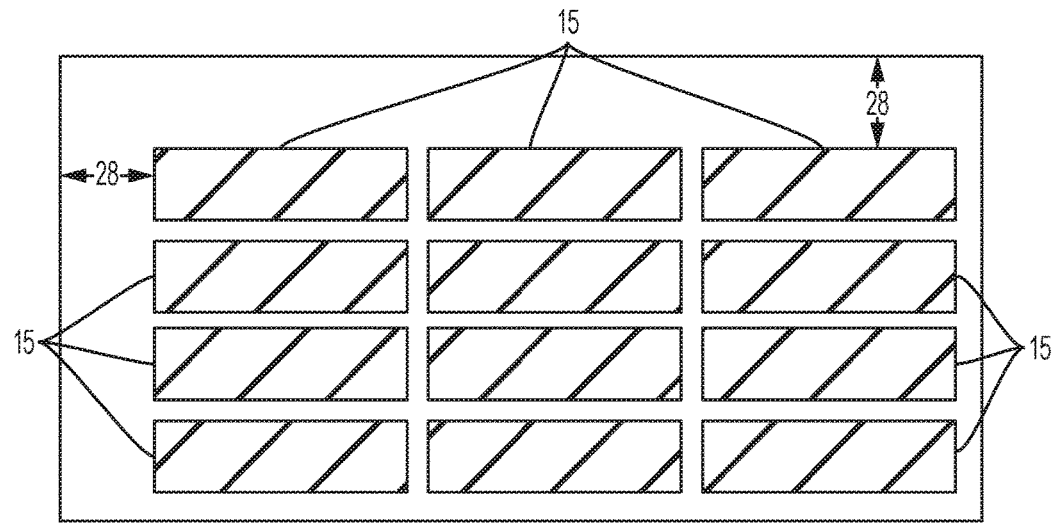
FIG. 3B represents a top down view of a substrate wafer with imprinted strain gauges thereon, having been generated by an embodiment of the method and system of strain gauge fabrication presented herein.

As shown with reference to FIGS. 3A and 3B, in this embodiment, the strain gauges 15 are configured in a pattern which takes advantage of the natural crystalline structures of the epitaxial material 16. As a result, this configuration will reduce strain gauge 15 damage during removal. Taking advantage of the crystalline structures may additionally enable decreases in scribe line width such that fabricated strain gauges 15 may be spaced closer to each other as no allowance for saw kerf is needed. The gauges 15 may thus minimize the real estate space of a wafer (such as second substrate wafer 12). As can be seen, if a wafer of 5 inches is represented, the method may allow for a reduction area 28 that can amount to substantial savings in wafer space. For example, an etching saw of 175 micrometers in width may be used in this methodology to design the strain gauge 15 and release pattern 22, ultimately resulting in a 23% space reduction over wafer real estate used through other known methodologies (i.e., FIG. 3A).

While exemplary embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further exemplary aspects of the present disclosure that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes can include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and can be desirable for particular applications.

What is claimed is:

1. A method of strain gauge fabrication, the method comprising:
    (a) providing a first substrate having a cavity side;
    (b) providing a second substrate having a semiconductor side;
    (c) positioning the second substrate in relation to the first substrate such that the semiconductor side and the cavity side are contactable;
    (d) processing the second substrate such that the first and second substrates are substantially joined via the semiconductor side and the cavity side;
    (e) etching the second substrate to define a strain gauge cantilevered over the cavity side of the first substrate; and
    (f) removing the strain gauge from the first substrate.

2. The method of claim 1, wherein the strain gauge is removed through the implementation of a vacuum device comprising a pick tip.

3. The method of claim 1, wherein:
    the processing limitation of (d) comprises:
    (f) coating a portion of the second substrate with a bonding material; and
    (g) bonding the second substrate to the first substrate such that the first and second substrates are substantially joined.

4. The method of claim 1, wherein a release pattern is etched onto the second substrate to define the strain gauge.

5. The method of claim 4, wherein:
    the release pattern is etched through a DRIE process; and
    the release pattern comprises a rectangle having three complete sides and a fourth perforated side.

6. The method of claim 1, wherein (e) further comprises additionally etching the second substrate to define a plurality of strain gauges configured to reduce the second substrate real estate.

7. A method of strain gauge fabrication, the method comprising:
    (a) providing a first substrate having a rimmed cavity;
    (b) providing a second substrate having an epitaxial layer;
    (c) positioning the second substrate in relation to the first substrate such that the epitaxial layer and the cavity face each other;
    (d) coating the epitaxial layer of the second substrate with a bonding material;
    (e) bonding the second substrate to the first substrate such that the first and second substrates are substantially joined via the epitaxial layer and cavity rim; and
    (f) etching the second substrate through a DRIE process to create a plurality of strain gauges defined by a release pattern and cantilevered over the cavity.

8. The method of claim 7, further comprising:
    (f) removing the strain gauge from the first substrate.

9. The method of claim 8, wherein the strain gauge is removed through the implementation of a vacuum device comprising a pick tip.

10. The method of claim 7, wherein the release pattern comprises a rectangle having three complete sides and a fourth perforated side.

11. The method of claim 7, wherein the plurality of strain gauges are configured to reduce the second substrate real estate.

* * * * *